United States Patent [19]
Bardsley et al.

[11] Patent Number: 5,754,410
[45] Date of Patent: May 19, 1998

[54] MULTI-CHIP MODULE WITH ACCESSIBLE TEST PADS

[75] Inventors: Thomas J. Bardsley; Jed R. Eastman, both of Poughkeepsie, N.Y.

[73] Assignee: International Business Machines Corporation, Armonk, N.Y.

[21] Appl. No.: 710,131

[22] Filed: Sep. 11, 1996

[51] Int. Cl.$^6$ ........................................ H05K 7/02
[52] U.S. Cl. .................. 361/777; 174/260; 174/261; 361/774; 361/780
[58] Field of Search ................ 174/250, 251, 174/253, 255, 260, 261, 265; 361/760, 774, 777, 778, 779, 780, 783, 792–795, 805, 806; 439/44, 45, 47, 48, 55, 65, 68, 69, 74, 83; 324/537, 755, 761, 765; 257/690, 692, 700, 686

[56] References Cited

U.S. PATENT DOCUMENTS

| | | |
|---|---|---|
| 4,489,364 | 12/1984 | Chance et al. . |
| 4,812,742 | 3/1989 | Abel et al. . |
| 4,922,377 | 5/1990 | Matsumoto et al. . |
| 5,243,140 | 9/1993 | Bhatia et al. . |
| 5,243,498 | 9/1993 | Scofield . |
| 5,262,719 | 11/1993 | Magdo . |
| 5,354,955 | 10/1994 | Gregor et al. . |
| 5,389,885 | 2/1995 | Swart . |
| 5,477,160 | 12/1995 | Love .................................... 324/765 |

FOREIGN PATENT DOCUMENTS

| | | | |
|---|---|---|---|
| 59-90948 | 5/1984 | Japan | 257/686 |
| 2-52262 | 2/1990 | Japan | 324/765 |

OTHER PUBLICATIONS

IBM Technical Disclosure Bulletin "AC Chip In–Place Test" by M. T. McMahon, Jr. vol. 17 No. 6 pp. 1607 and 1608, Nov. 1974.

*Primary Examiner*—Donald Sparks
*Attorney, Agent, or Firm*—DeLio & Peterson; John J. Tomaszewski; Aziz M. Ahsan

[57] ABSTRACT

An improved multi-chip-module having a substrate having top and bottom surfaces, a plurality of chips on the top surface, a plurality of pins on the bottom surface, each chip having at least one lead extending through the substrate and conductively coupled to a corresponding pin, the module having at least one net associated with the chips and completely embedded within the substrate, the improvement comprising at least one pad attached to the bottom surface of the substrate, and a conductive path conductively coupled between the pad and the net.

10 Claims, 5 Drawing Sheets

MULTI-CHIP MODULE WITH ACCESSIBLE TEST PADS

BACKGROUND OF THE INVENTION

1. Field of the Invention

The present invention is generally related to multi-chip modules.

2. Problem to be Solved

A multi-chip-module (MCM) is a module or package capable of supporting several chips on a single package. Most multi-chip packages are made of ceramic. Multi-chip-modules offer space and performance advantages over traditional electronic component packaging. MCMs are currently used in applications requiring high performance. As system clock frequencies of personal computers approach 200 MHz and functional densities are increased, more electronic circuit designs will require MCMs. MCMs typically provide cost benefits. However, test and diagnostics issues are two key inhibitors to the widespread adoption of MCM technology. MCMs are difficult to test and are difficult to diagnose when failure occurs.

Test vectors generated for individual chips (in packaged or wafer form) assume that all the necessary chip signal inputs and outputs (I/O) are available to the test equipment. On electronic component packages, it is highly desirable to have as many accessible inputs/outputs (I/Os) as possible. Test engineers typically require as many accessible I/Os as possible to facilitate testing and diagnostic analysis. However, circuit designers want to use the I/Os to enable more functions on the module. When there are too many I/O, the cost of the board to which the electronic component package is connected increases because the wiring becomes complicated and the costs of the socket increases.

Test data used to test chips individually cannot be used to test chips mounted on an MCM. MCM level testing is relatively higher level of testing than wafer or single-chip-package level testing. Automatic test pattern generation (ATPG) software is typically used in manufacturing processes to generate test data for an individual chip or die. However, such software is typically not configured to generate test data for the logic realized by an MCM due to the MCM's size, i.e. the large number of chips mounted on the MCM.

As developments in semiconductor technology continue, CMOS (complementary metal-oxide semiconductor) in particular, the number of circuits that can be realized on an individual chips increase. Thus, it becomes more difficult to generate test data for such high density chips. For multi-chip modules having several chips on one module, the problem is magnified. For example, if there is difficulty in generating tests for a microprocessor chip having about seven (7) million transistors, there will be even greater difficulty trying to generate a unique set of test patterns for a multi-chip module composed of the microprocessor and several other chips having comparable densities. In order to generate test data for the entire module, a separate logic model of the entire MCM must be created before generating the data. Such a separate logic model is significantly more complex than the logic models created to generate test data for individual chips or die. Furthermore, MCM logic models require significantly more computer processing time than generation of test data for individual chips.

Another problem in testing MCMs is the inability to fault-isolate inoperative chips. Some chip I/Os are not accessible when the chips are mounted to an MCM. It is typically desired to characterize critical nets in terms of rise-times, set-up, hold times and other operating parameters when an MCM is initially powered-up. As used herein, the term "nets" refers to a group of terminals interconnected to have a common d.c. electrical potential in an electrical component package. Typically, such critical nets on MCMs cannot be characterized because they do not project from the module and are not accessible. Thus, probes and other detection equipment are of no use when trying to test such nets. Therefore, if a faulty net exists between two or more chips on a multi-chip package, it is difficult to determine the location of the defect. Such difficulty decreases production yield. Furthermore, since fault-isolation to a specific chip is not possible, it is often necessary to replace the entire module if a defective chip exists on the module. This is significantly more expensive than replacing a single defective chip.

An example illustrating the difficulties and problems that exists when it is not possible to fault-isolate to an individual chip in an MCM that has one chip that transmits signals (a driver chip) and another chip receiving the signals (a receiver chip) and the connection between the driver chip and receiver chip is embedded within the MCM substrate and is not accessible. If during testing of the MCM, the receiving chip does not receive the transmitted signals, it must be determined whether the failure is due to: (i) a defective driver chip, (ii) a defective receiver chip, or (iii) a break in the connection between the driver and receiver chips.

It is difficult, if not impossible, to change the design once the first batch of MCM carriers have been fabricated. Altering the MCM substrate layers and assembling the carrier typically consumes significantly more time than making similar changes to a printed circuit board. Furthermore, unlike an MCM, a printed circuit board wiring may be changed by physically drilling new openings and adding solder wires where necessary. Such changes cannot be made to the MCM without damaging or rendering the MCM inoperative.

There have been many attempts to solve the aforementioned problems of testing MCMs. One method involves the addition of pins to the bottom of the module in order to gain access to nets on the module. However, this increases manufacturing costs. Furthermore, the pins are typically gold-plated and therefore expensive. Additionally, these pins would only be used for testing purposes and would not be used as an input or output when the MCM was in operation in its actual environment. The problem then arises of what to do with these pins once testing is complete. One solution is to alter the final circuit board to which the MCM is mounted to provide additional openings to receive the additional pins added to the MCM. Again, this increases manufacturing costs.

Another attempt is to thoroughly test the dies or chips before they are mounted to the module such that the quality and reliability of the module will be high after it is assembled. This is accomplished by testing and burning-in (stressing) the bare dies before they are packaged on the MCM. Although this may appear to solve the test and diagnostic problem by eliminating extensive testing and diagnostic procedures at the module level, this technique normally involves expensive fixturing to handle and contact the die.

Another attempt to solve the aforementioned problems relating to testing MCMs is known as "self-test". Although "self testing" exists in many forms, the basic concept comprises designing logic into a chip such that the chip tests itself with minimal effort with the use of peripheral test equipment. The "self-test" technique reduces the number of pins that need to be contacted by the test equipment. However, the additional logic designed into the chip requires additional engineering, design and manufacturing time thereby significantly increasing the costs to produce the chip.

A further attempt to solve the problems relating to testing MCMs is boundary scan-based testing. Although boundary scan based testing provides controllability and observability with respect to nodes internal to the module that cannot be probed, boundary scanning can actually degrade the performance of the die or chip being tested.

Still, another attempt to solve the problems of testing MCMs is referred to as "chip-in-place" testing. This technique entails contacting EC pads around an individual chip with a gang probe to test that chip while all other chips on the MCM are configured in a tri-state condition, i.e. turned off. After a chip is tested, the gang probe is automatically positioned over the next chip on the module. This process continues until all the chips are tested. This technique is used when there is no free space on the bottom of the module and all test pads on the MCM are on the same side as the chips. However, gang probes are expensive and relatively unreliable. Furthermore, positioning the probe on the pads involves expensive optics and positioning systems.

Bearing in mind the problems and deficiencies of prior systems for testing multi-chip-modules, it is an object of the present invention to provide a multi-chip-module that permits testing of all integrated chips mounted thereto.

It is another object of the present invention to provide a multi-chip-module that allows for testing of all nets embedded in the substrate of the multi-chip-module.

A further object of the invention is to provide a multi-chip-module that allows for testing of all integrated circuit chips mounted thereto in relatively less time than for conventional multi-chip-modules.

It is yet another object of the present invention to provide a multi-chip-module that allows for testing of all integrated circuit chips mounted thereto in a cost effective manner.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an improved multi-chip-module having a substrate having top and bottom surfaces, a plurality of chips on the top surface, a plurality of pins on the bottom surface, each chip having at least one lead extending through the substrate and conductively coupled to a corresponding pin, the module having at least one net associated with the chips and completely embedded within the substrate, the improvement comprising at least one pad attached to the bottom surface of the substrate, and a conductive path conductively coupled between the pad and the net.

In a related aspect, the present invention is directed to a multi-chip-module having a substrate having top and bottom surfaces, a plurality of chips on the top surface, a plurality of pins on the bottom surface, the pins being arranged in an array having a central portion devoid of pins, each chip having at least one lead extending through the substrate and conductively coupled to a corresponding pin, the module having at least one net associated with the chips and completely embedded within the substrate, the improvement comprising at least one pad attached to a portion of the substrate bottom surface that corresponds to the central portion of the array, and a stub conductively coupled between the pad and the net.

In a further aspect, the present invention is directed to a multi-chip-module comprising a substrate having top and bottom surfaces, a plurality of chips on the substrate top surface, a plurality of pins attached to the substrate bottom surface, each chip having at least one lead extending through the substrate and conductively coupled to a corresponding pin, the module having at least one net associated with the chips that is completely embedded within the substrate, at least one pad attached to the bottom surface of the substrate, and a conductive path conductively coupled between the pad and the net.

In yet another aspect, the present invention is directed to a fixture for use with a multi-chip-nodule, the multi-chip-nodule having a substrate having top and bottom surfaces, a plurality of chips on the substrate top surface, a plurality of pins attached to the substrate bottom surface, the pins being arranged in an array having a central portion devoid of pins, each chip having at least one lead extending through the substrate and conductively coupled to a corresponding pin, the module having at least one net associated with the chips that is completely embedded within the substrate, at least one pad attached to the bottom surface of the substrate, and conductive path conductively coupled between the pad and the net, the fixture comprising:

- a zero-insertion-force socket having a top surface for receiving the multi-chip-module, the socket top surface having an array of pin inlets for receiving the pins of the array attached to the substrate bottom surface, the socket top surface further comprising at least one probe for conductively contacting the pad on the substrate bottom surface, the socket bottom surface having a plurality of socket pins attached thereto, at least one socket pin being conductively coupled to the probe and the remaining socket pins being conductively coupled to the pin inlets; and
- a circuit board having a plurality of inlets for conductively receiving the socket pins, the circuit board further including an interface terminal for connection to peripheral testing devices, the terminal having a plurality of pins, each terminal pin being conductively coupled to a corresponding socket pin.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

In describing the preferred embodiment of the present invention, reference will be made herein to FIGS. 1–9 of the drawings in which like numerals refer to like features of the invention.

Figure 1:
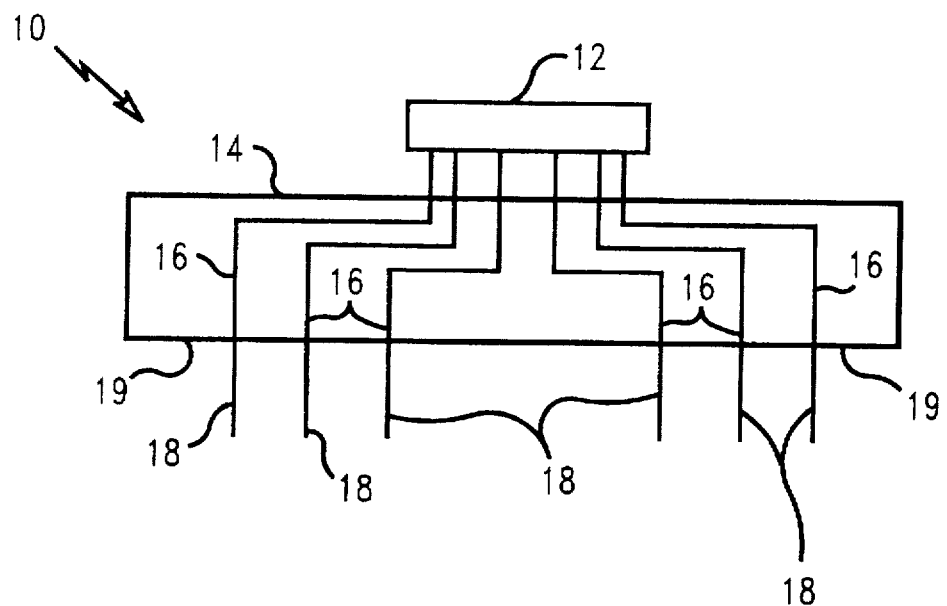
FIG. 1 is a side-elevational schematic view of a single-chip module wherein all the chip input/output nets are accessible.

Referring to FIG. 1, a single-chip-module (SCM) 10 is shown. Module 10 comprises chip or die 12 and substrate 14. Chip 12 has conductive leads 16 which extend through the substrate and are conductively coupled to pins 18 that are attached to bottom surface 19 of substrate 14. The aforementioned problems discussed above do not arise when testing SCM 10 since each lead 16 is conductively coupled to a corresponding one of the pins 18 which are accessible to peripheral testing equipment. As used herein, the term "pin" refers to pins, solder balls or solder columns. The pins are used to input and output signals to and from, respectively, a SCM or MCM. The pins are also used to provide supply or reference voltages and ground potential.

Figure 2:
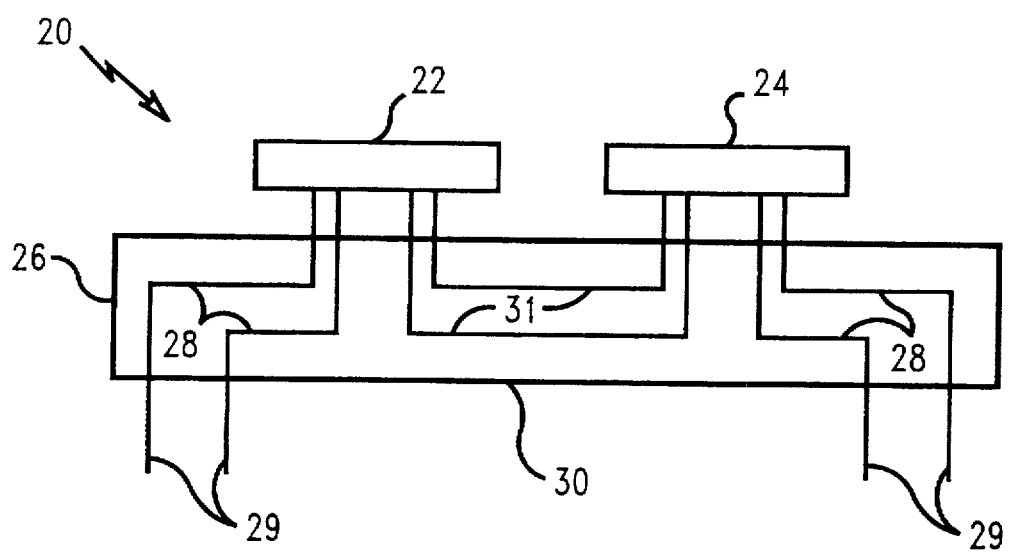
FIG. 2 is a side-elevational schematic view of a conventional multi-chip-module having nets embedded within a substrate of the module and therefore not accessible.

Referring to FIG. 2, a conventional multi-chip-module (MCM) 20 is shown. MCM 20 comprises chips 22, 24 and substrate 26. It is to be understood that MCM 20 may contain more than two (2) chips. However, for purposes of the ensuing discussion, only two (2) chips are shown. Chips 22 and 24 have conductive leads 28 which extend through substrate 26 and are conductively coupled to pins 29 which are attached to bottom surface 30 of substrate 26. MCM 20 also has nets 31 that are embedded within substrate 26 and do not conductively contact any of pins 29. Thus, unlike SCM 10 shown in FIG. 1, the aforementioned problems discussed above do arise when attempting to test chips 22 and 24 since nets 31 are not accessible.

Figure 3:
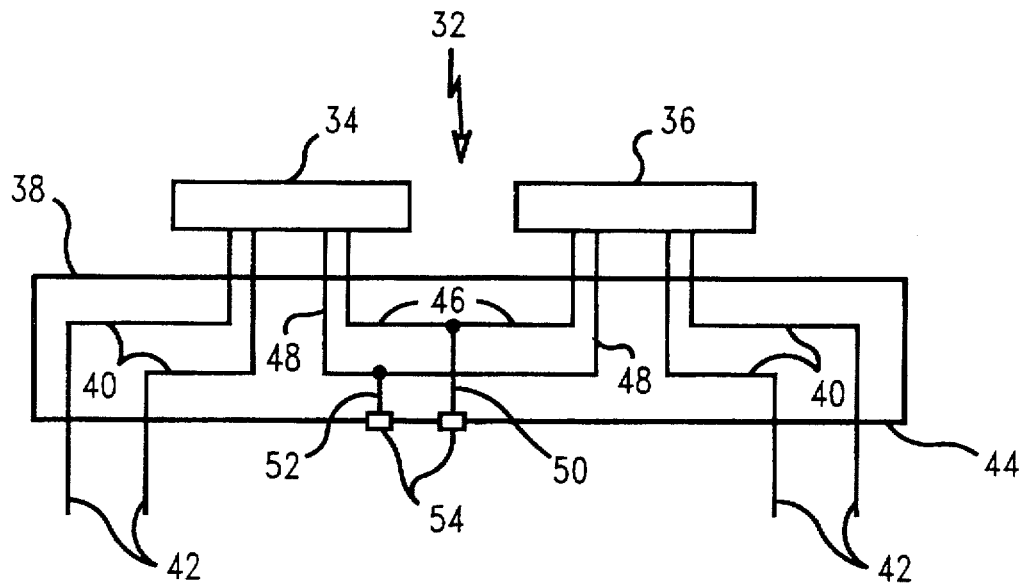
FIG. 3 is a side-elevational schematic view of a multi-chip-module of the present invention.

Referring to FIG. 3, MCM 32 of the present invention is shown. MCM 32 comprises chips 34, 36 and substrate 38. It is to be understood that MCM 32 may contain more than two (2) chips. Chips 34 and 36 have leads 40 extending through substrate 38 and conductively coupled to pins 42 attached to bottom surface 44 of substrate 38 and arranged in an array. MCM 58 has nets 46 and 48 formed by leads emanating from chips 34 and 36. Nets 46 and 48 are not conductively coupled to any of pins 42. Thus, nets 46 and 48 are completely embedded within substrate 38. Nets 46 and 48 are conductively coupled to stubs 50 and 52, respectively. Stubs 50 and 52 are conductively coupled to pads 54. Pads 54 are positioned on bottom surface 44 of substrate 38 such that pads 54 are located in the center of the grid array of pins 42. This will be discussed in greater detain below. Each net is now accessible and can be characterized, i.e. rise time, fall times and other characteristics can be measured. Thus, pads 54 allow complete in-circuit-testing of MCM 32.

The conductive path between a net and a corresponding pad is referred to as a "stub". If the stubs are too long in length, the stub can act as an antenna during operation. Thus, it is highly preferable that stubs be kept as short as possible.

Figure 5:
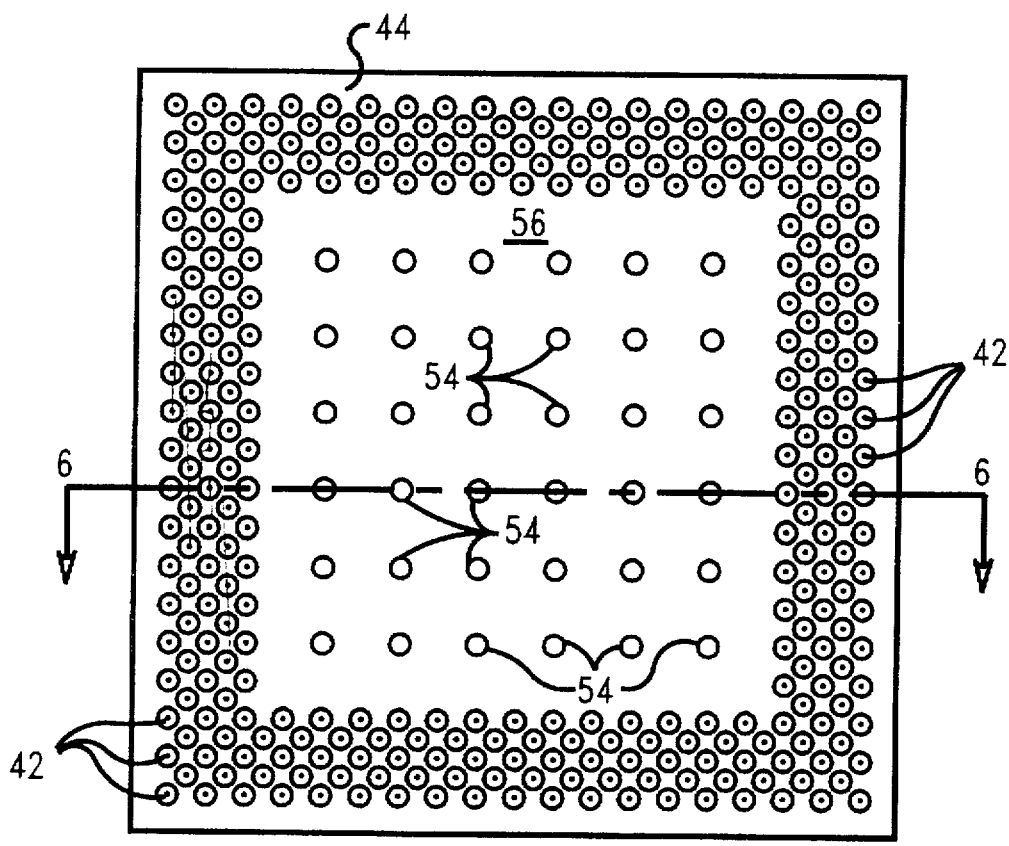
FIG. 5 is a bottom plan view of the multi-chip-module of the present invention.
Figure 6:
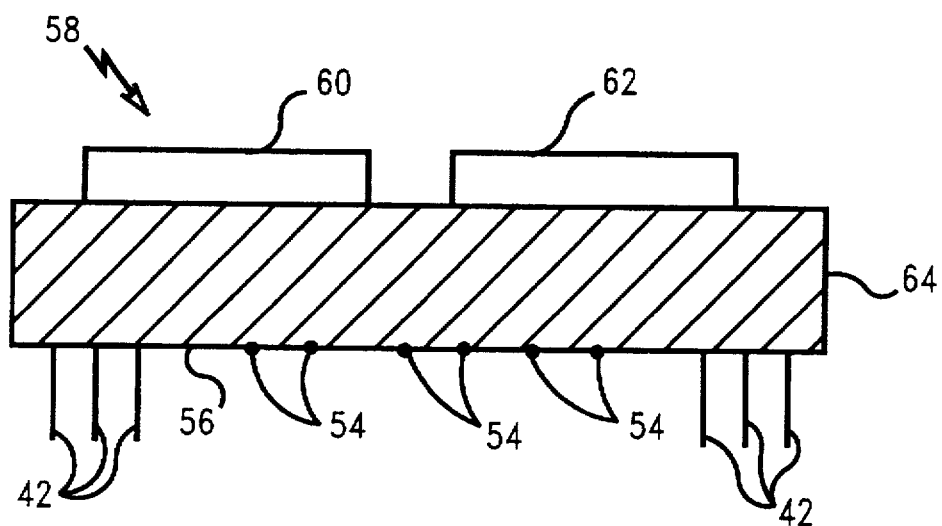
FIG. 6 is a cross-sectional view taken along line 6—6 of FIG. 5.

Pin grid array modules come in several standard sizes and pin patterns. Most designs do not use all the available spaces where pins could be located. Pins are not typically positioned in the center portion of the bottom surface of the MCM substrate. Pins are not located in the center of the pin grid array because the chip will be bonded to the same side of the substrate as the pins in the center, in standard, wire bond packaging. The invention takes advantage of this standard form factor. Therefore, as shown in FIGS. 5 and 6, it is preferred that pads 54, which are conductively coupled to nets completely embedded in the MCM substrate, be positioned in center area 56 of the array of pins.

Thus, all I/Os of every chip on the MCM are now accessible to test and diagnostic equipment. The test data used to test the chip at the wafer level can also be used to test the chip when it is mounted to the MCM. Separate test data to simultaneously test the chips on the module is not required. Furthermore, MCM 32 of the present invention facilitates diagnostic testing or fault-isolation testing to locate the actual defect. Since tests are run on each chip, if a test indicates a failure, the fault is most likely in the chip being tested. After the MCM is completely tested, it may be plugged into a system for operation. Pins 42 of MCM 32 can be plugged into a standard, commercially available low-cost socket. Pads 54 are substantially flat and do not contact any part of the socket and thus have a "floating" voltage potential.

Preferably, pads 54 preferably have a substantially round shape. However, other shapes may be used as well. The pads may be of varying sizes. If the capacitance of a specific net is not critical and a relatively small number of pads are being used, the pads may be configured to have a relatively large size to facilitate targeting and contact by the testing probes. However, if capacitance of a specific net is critical, then the corresponding pads should be relatively small. Pads 54 may be gold-plated to facilitate conductive contact with probing devices. Gold-plating is typically used to provide a reliable contact surf ace over many contacts. However, gold-plating is not required. Other types of metals can be used to plate the pads. If the pads are to be used for only a few contacts, e.g. 1–5 contacts, the pads can be plated with a very thin gold layer or configured without plating.

If the probability exists that during mechanical handling, foreign particles or material may inadvertently conductively connect pads 54 together or to other components, pads 54 may be covered with a tape or other inexpensive, non-conductive material, or sealed with an epoxy-like material (encapsulated) in order to prevent such inadvertent conductive contact. This also prevents the pads from being susceptible to ESD (electro-static-discharge).

Figure 4:
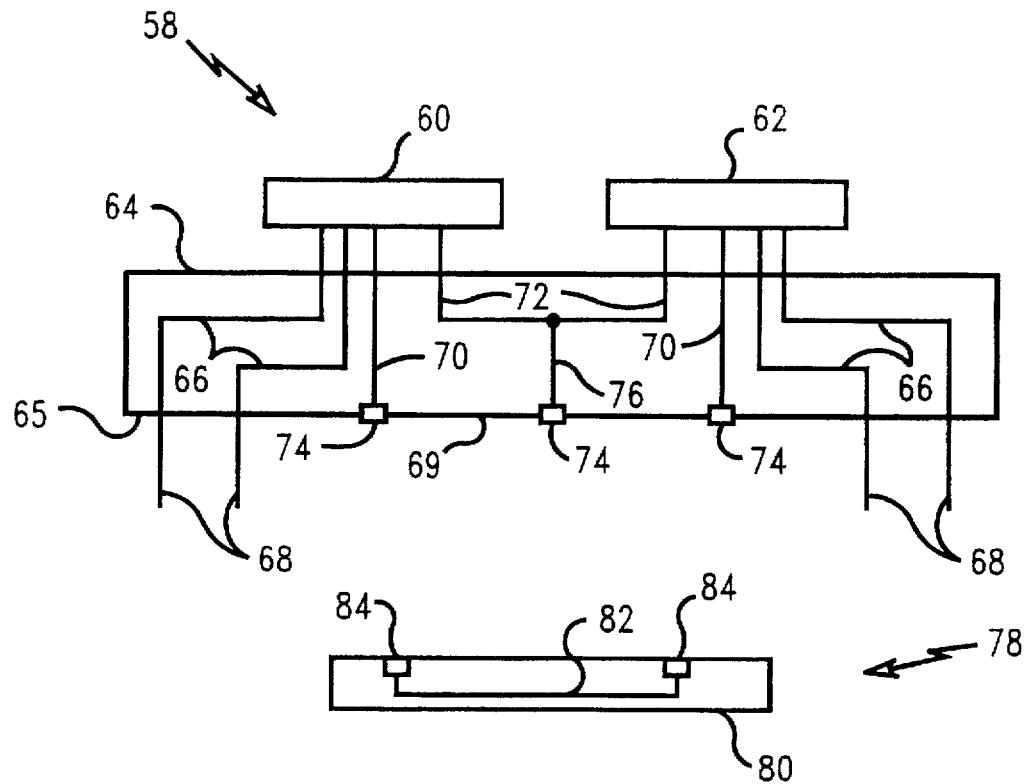
FIG. 4 is a side elevational view of the multi-chip module of FIG. 3 and a test pad cover.

Some chips do not have a tri-state configuration. Thus, in the case of an MCM having a driver chip and a receiver chip, either both chips must be tested at the same time (defeating the ability to re-use test data), or the net must be broken. In accordance with the present invention, the MCM is fabricated such that these nets are not completed in the substrate but are conductively coupled to pads on located on the bottom of the substrate. First, the individual chips are tested after being joined to the substrate. Then, the pads are connected together to complete the net for system usage. This configuration is illustrated in FIG. 4. A major advantage of the invention is that the chip does not have to be specially designed for use in an MCM thereby decreasing cycle time and reducing circuitry on the chip.

Referring to FIG. 4, MCM 58 is identical to MCM 32 in construction. MCM 58 comprises chips 60, 62 and substrate 64. Chips 60 and 62 have leads 66 extending through substrate 64 and which are conductively connected to pins 68 that extend from the bottom surface 69 of substrate 64. MCM 58 further includes lead 70 and net 72. Lead 70 is directly and conductively coupled to pads 74. Net 72 is conductively coupled to stub 76 which is conductive stub 74. MCM 58 further includes pad cover 78 which comprises body portion 80, wiring 82 formed on or within body portion 80 and pads 84. Pads 84 are conductively coupled to wiring 82 and adapted for electrically conductive coupling to pads 74. After MCM 58 is completely tested, cover 78 is attached to bottom surface 65. Wiring 82 and pad 84 complete the MCM circuit. Pads 74 need only protrude a distance from surface 65 that is sufficient to provide conductive coupling between pads 74 and pads 84 when cover 78 is joined to bottom surface 65 of MCM 58. Cover 78 also protects bottom surface 65 from foreign particles that may short pads 74 together. Body portion 80 of cover 78 may be fabricated from plastic, tape, ceramic or other electrically non-conductive materials, or it can be a "glob-top" seal.

The following example illustrates an advantage of the MCM configuration shown in FIG. 4. A microprocessor may be designed to run at 200 MHz. However, not all the chips fabricated on the wafer may be able to operate at 200 MHz. Some chips may be able to operate only at 60, 120 or 150 MHz. Due to limitations in wafer probe technology, a chip's operating speed cannot be determined until it has been packaged. When a chip is placed on an MCM, the speed of the microprocessor may not be known. The clock chip that sets the speed may be on the same module and the speed of the clock chip may have to be set by tying clock control signals to logic level "1" (high) or logic level "0" (low) values. The MCM is configured so that the clock control lines are conductively coupled to pads on the bottom of the MCM. Once the speed of the microprocessor is characterized, the appropriate clock control lines can be tied to a logic level "1" or logic level "0" by connecting the appropriate pads to "spare" logic "1" or "0" pads. The ensuing discussion will now describe a further embodiment of the present invention that embodies the concept described above.

Figure 7:
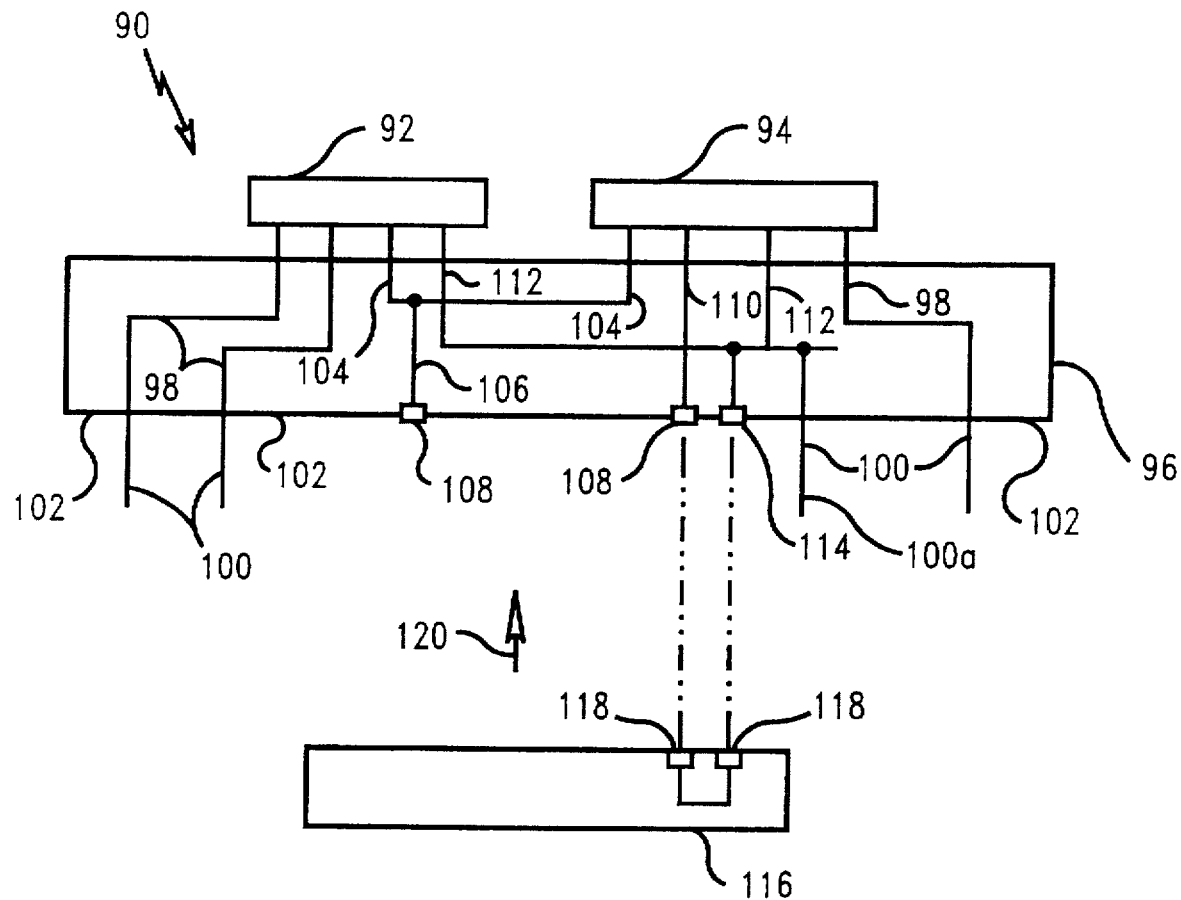
FIG. 7 is a side-elevational view of an alternate embodiment of the multi-chip module of the present invention and a test pad cover.

Referring to FIG. 7, MCM 90 of the present invention comprises at least two chips 92, 94, substrate 96 and leads 98. Leads 98 extend through substrate 96 and are conductively coupled to pins 100 that extend from bottom surface 102 of substrate 96. MCM 90 further comprises nets 104 and 110 formed by leads that emanate from chips 92 and 94. Net 104 is conductively coupled to stub 106 which is conductively coupled to pad 108. Lead 110 is directly conductively coupled to pad 108. Net 112 is at a logic level "0" and is conductively coupled to lead 100a. MCM 90 further comprises spare pad 114 which is conductively coupled to net 112. It is to be understood that MCM 90 may be configured to provide extra pads conductively coupled to a logic "1" voltage potential (typically 3.3–5.0 volts d.c.). If it becomes necessary to modify the circuit of MCM 90 after MCM 90 is assembled, cover 116 may be used to effect such modifications without making any physical alterations to substrate 96. Cover 116 is similar in construction to cover 78 (see FIG. 4). Cover 116 comprises pads 118 which are conductively coupled together. For example, it may become necessary to tie lead 110, a control line, to a logic "1" level. To accomplish this, pad 108 may be conductively coupled to pad 114. Pads 118 are positioned such that they are aligned with and conductively coupled to pads 108 and 114 when cover 116 is joined to bottom 102 of substrate 96. Pads 108 and 114 are conductively coupled together by cover 116. Thus, since pads 108 and 114 are now conductively coupled, lead 110 is now coupled to a logic "1" level. Thus, circuit modifications may be realized without making time consuming physical alterations to substrate 96. Furthermore, if it is necessary to change the circuitry back to its original state, it is only necessary to remove cover 116. If the EC is final, fixed covers that cannot be removed may also be used.

Figure 8:
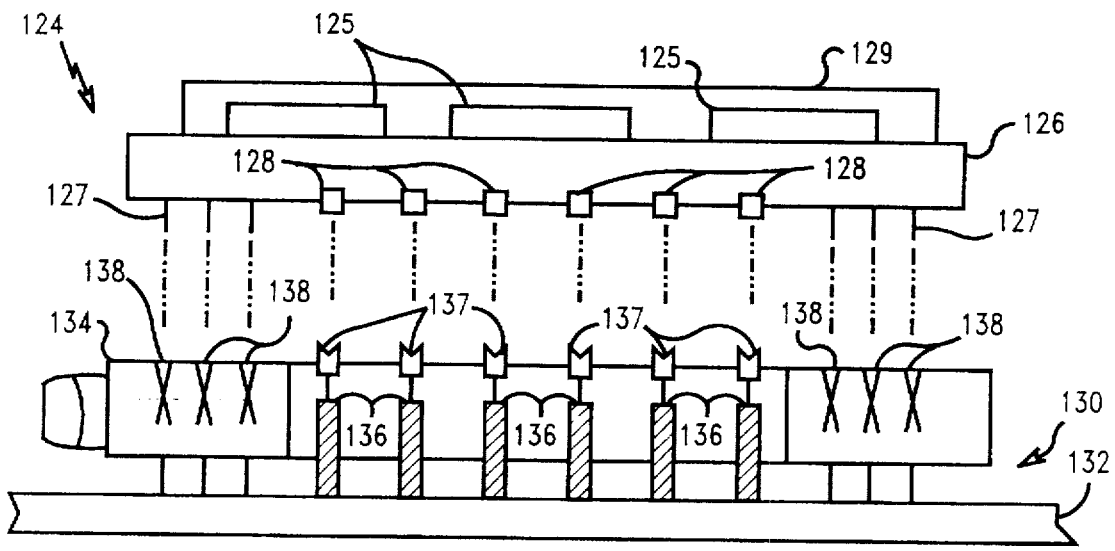
FIG. 8 illustrates the interconnection between the multi-chip-module of the present invention and a test fixture of the present invention.
Figure 9:
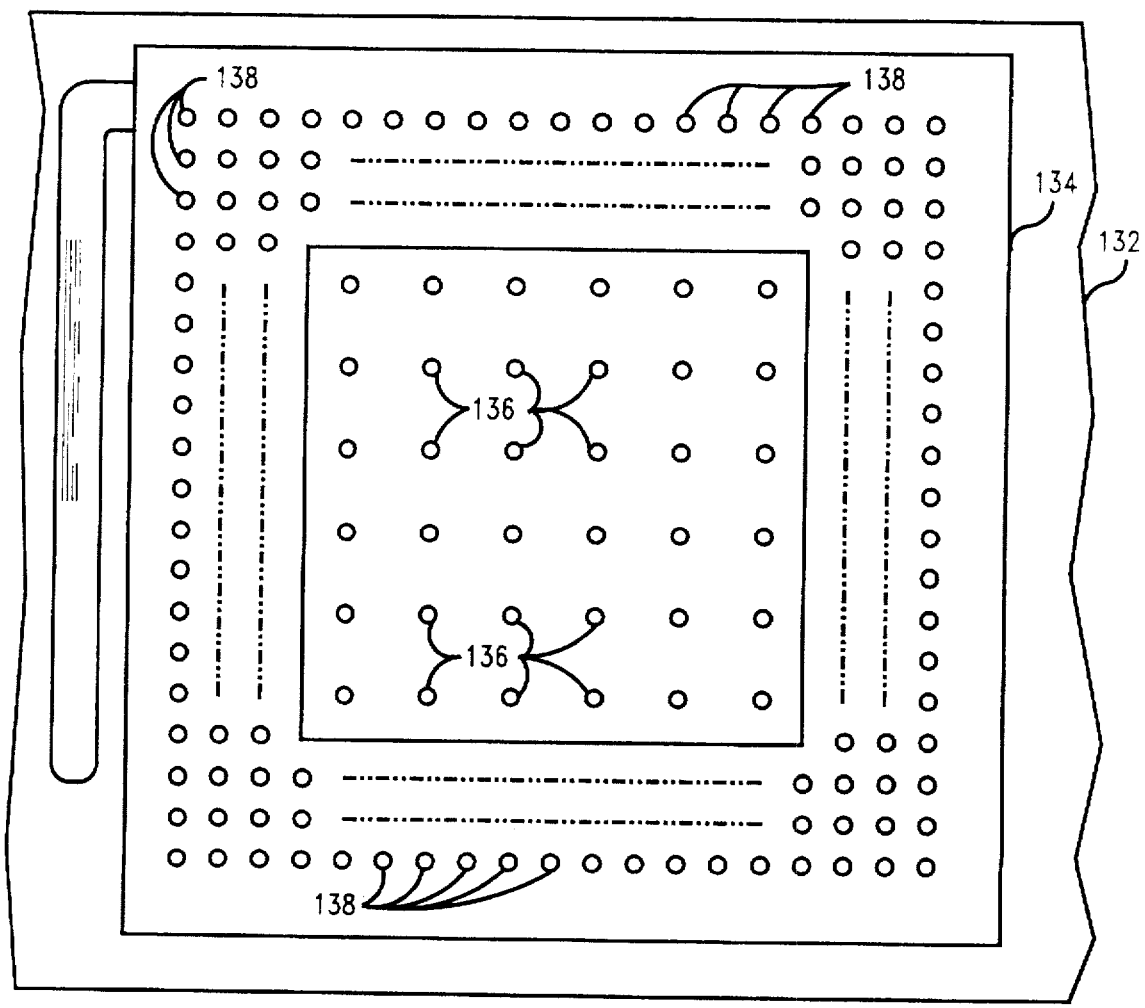
FIG. 9 is a top plan view of the test fixture shown in FIG. 8.

Referring to FIGS. 8 and 9, a test fixture is shown which can be used with the MCM of the present invention to facilitate engineering debug, manufacturing testing and diagnostics of the MCM. Referring to FIG. 8, MCM 124, which is similar in construction to MCM 32 (see FIG. 3) and MCM 58 (see FIG. 6), comprises chips 125 joined to substrate 126. Pins 127 extend downward from substrate 126. Pads 128 are joined to the bottom of MCM 124 and function in the same manner as pads 54 and 74 discussed above. Chips 125 are encapsulated by layer 129.

Referring again to FIG. 8, test fixture 130 comprises circuit board 132 and socket 134. Circuit board 132 is preferably a printed circuit board. Socket 134 comprises pins 136 arranged in an array. Pins 136 have surfaces 137 adapted for making electrically conductive contact with pads 128. Preferably, pins 136 are of the pogo-type. Socket 134 also includes pin inlets 138 adapted for receiving the pins 127 of MCM 124. In a preferred embodiment, socket 134 is a zero-insertion-force (ZIF) type socket and can be realized by modifying commercially available industry standard ZIF sockets thereby avoiding significant modifications to the interface between the MCM and the socket.

Although industry-standard pogo pins are shown in FIGS. 8 and 9, other probe structures could be used. If a very large number of MCM pads are to be conductively contacted, a very dense probe array could be used. If high-frequency signals are to be probed and shielding is required, a shielded, grounded probe may be included in the probing structure.

The MCM of the present invention may be fabricated from organic or ceramic based materials. Furthermore, the MCM of the present invention may be connected to a next level of packaging with pins, solder balls and solder columns. Additionally, the chips may be joined to the MCM of the present invention by wire bonding or C4 joining.

In a preferred embodiment, test pads 54, 74 and 128 are configured to have a relatively small size and are used with a high-density gang probe thereby allowing a very large number of I/O to be accessible in comparison to the number of I/O that would be accessible by just adding pins.

Thus, the MCM of the present invention allows diagnostics at the module level thereby allowing the die to be burned-in (stressed) at the module level. Dies having defects can be fault-isolated and replaced. As a result, the need for known "good dies" is reduced. Furthermore, the number of test pins required on a MCM is reduced since these pins are replaced with pads that conductively contact corresponding pins of test fixture 130. The reduction in the pins on the MCM simplifies the design and reduces manufacturing costs. The pads of the MCM are even accessible after the module has been encapsulated. The performance of the nets embedded in the substrate of the MCM is not degraded by conductively coupling the nets to external MCM pads. The MCM of the present invention does not use space on top of the MCM contrary to conventional chip-in-place testing techniques or EC pads on thermal conduction modules.

Additionally, the MCM chip design is not complicated by chips with boundary latches and chip design is not constrained by IEEE Standard No. 1149.1 or other boundary-scan based design rules.

Chips that are not configured to have three states (tri-state chips) can be realized in the MCM of the present invention and tested at the MCM level. Thus, almost all industry standard chips can be mounted on MCMs in a cost effective manner.

Testing the MCM of the present invention does not involve expensive test fixtures and moveable gang probes as required by conventional chip-in-place testing techniques. Furthermore, the test data for individual chips can be used to test the chips when on the MCM thereby eliminating the need for module-level test data. The MCM of the present invention facilitates fault isolation when the MCM failure occurs. The MCM of the present invention also allows inexpensive modifications or EC (engineering change) to be made to the MCM circuit design.

The present invention also provides a method for sorting components by speed, available memory, or other criteria after the chips have been joined to the carrier (substrate). The components do not need to be sorted at the wafer level, which is costly and, sometimes, impossible. For example, an MCM with a processor chip designed to run at 120 MHz may yield, in production, chips that run at 120, 100, 90 and 60 MHz. Memory chips attached to the MCM may be sorted to allow a local bus to run at 20, 33 or 60 MHz. The quality level of these chips is not know unless an expensive wafer level test is performed. The process proposed involves joining the uncharacterized bare die to the MCM and then determining the maximum processor speed and local bus speed, and setting these speeds with the 'cover' described above.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. In a multi-chip-module having a substrate having top and bottom surfaces, a plurality of chips on the top surface, a plurality of pins on the bottom surface, each chip having at least one lead extending through the substrate and conductively coupled to a corresponding pin, the module having at least one net associated with the chips and completely embedded within the substrate, the improvement comprising
    at least one pad attached to the bottom surface of the substrate; and
    a conductive path conductively coupled between the pad and the net.

2. The improved multi-chip-module as set forth in claim 1 wherein the conductive path comprises a stub.

3. The improved multi-chip-module as set forth in claim 2 wherein the pad has a surface adapted for conductive contact with probing devices.

4. The improved multi-chip-module as set forth in claim 1 further comprising at least two nets embedded in the substrate, at least two pads attached to the bottom surface of the substrate, and at least two conductive paths, each path coupling one of the nets and one of the pads.

5. The improved multi-chip-module as set forth in claim 1 wherein the pad has a substantially round shape.

6. The improved multi-chip-module as set forth in claim 1 wherein the pad is plated with a metal to facilitate conductive contact with probing devices.

7. A multi-chip-nodule comprising:
    a substrate having top and bottom surfaces;
    a plurality of chips on the substrate top surface;
    a plurality of pins attached to the substrate bottom surface, each chip having at least one lead extending through the substrate and conductively coupled to a corresponding pin, the module having at least one net associated with the chips that is completely embedded within the substrate;
    at least one pad attached to the bottom surface of the substrate; and
    a conductive path conductively coupled between the pad and the net.

8. In a multi-chip-module having a substrate having top and bottom surfaces, a plurality of chips on the top surface, a plurality of pins on the bottom surface arranged in an array the array having a central portion devoid of pins, each chip having at least one lead extending through the substrate and conductively coupled to a corresponding pin, the module having at least one net associated with the chips and completely embedded within the substrate the improvement comprising:
    at least one pad attached to the bottom surface of the substrate that corresponds to the central portion of the array; and
    a conductive path conductively coupled between the pad and the net.

9. In a multi-chip-module having a substrate having top and bottom surfaces, a plurality of chips on the top surface, a plurality of pins on the bottom surface, each chip having at least one lead extending through the substrate and conductively coupled to a corresponding pin, the module having at least two nets associated with the chips and completely embedded within the substrate, the improvement comprising
    at least two pads attached to the bottom surface of the substrate;
    at least two conductive paths, each path conductively coupling one of the pads and one of the nets; and
    a cover having a non-conductive body portion, a wiring network supported by the body portion, and at least two pads supported by the body portion, the cover adapted for attachment to the substrate bottom portion, each pad of the cover being aligned with and conductively coupled to a corresponding pad attached to the substrate bottom surface when the cover is attached to the substrate bottom surface.

10. In a multi-chip-module having a substrate having top and bottom surfaces, a plurality of chips on the top surface, a plurality of pins on the bottom surface, each chip having at least one lead extending through the substrate and conductively coupled to a corresponding pin, the module having at least one net associated with the chips and completely embedded within the substrate, the improvement comprising
    at least one pad attached to the bottom surface of the substrate;
    a conductive path conductively coupled between the pad and the net; and
    a cover having a non-conductive body portion adapted for attachment to the substrate bottom surface to insulate the pad from foreign particles and inadvertent conductive contact with other module components.

* * * * *